(12) United States Patent
Holman, IV et al.

(10) Patent No.: US 6,444,904 B1
(45) Date of Patent: Sep. 3, 2002

(54) ORTHOGONAL ASSEMBLY LATCH

(75) Inventors: Martin E. Holman, IV, Boca Raton; Johnny Ray Shealy, Lake Worth; Michael Carlos Menard; Oscar Javier Pichardo, both of Boynton Beach, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/553,722

(22) Filed: Apr. 20, 2000

(51) Int. Cl.[7] .............................. H02G 3/08; H05K 5/00
(52) U.S. Cl. ...................... 174/52.1; 206/1.5; 220/4.21; 220/4.02; 361/752
(58) Field of Search .................. 174/50, 52.1; 361/752, 361/796, 801, 807; 206/1.5; 220/4.21, 4.02

(56) References Cited

U.S. PATENT DOCUMENTS

| 4,746,008 A | * | 5/1988 | Heverly et al. ............... 206/1.5 |
| 5,205,413 A | * | 4/1993 | Cautereels et al. .......... 206/541 |
| 5,251,104 A | | 10/1993 | Wandt et al. ................. 361/736 |
| 5,469,982 A | | 11/1995 | Gordecki et al. ........... 220/4.02 |
| 5,505,328 A | * | 4/1996 | Stribiak ....................... 220/410 |
| 5,613,237 A | | 3/1997 | Bent et al. .................... 455/351 |

* cited by examiner

*Primary Examiner*—Anthony Dinkins
*Assistant Examiner*—Hung V Ngo
(74) *Attorney, Agent, or Firm*—Philip P. Macnak; Randi L. Dulaney; Andrew S. Fuller

(57) ABSTRACT

An orthogonal latch assembly includes a latching member 300 and a catch 400 having a first wedge shaped section 202 and a second wedge shaped section 204. The first wedge shaped section 202 enables engagement of the catch 400 with latching member 300. The second wedge shaped section 204 enables disengagement of the latching member 300 from the catch 400.

20 Claims, 5 Drawing Sheets

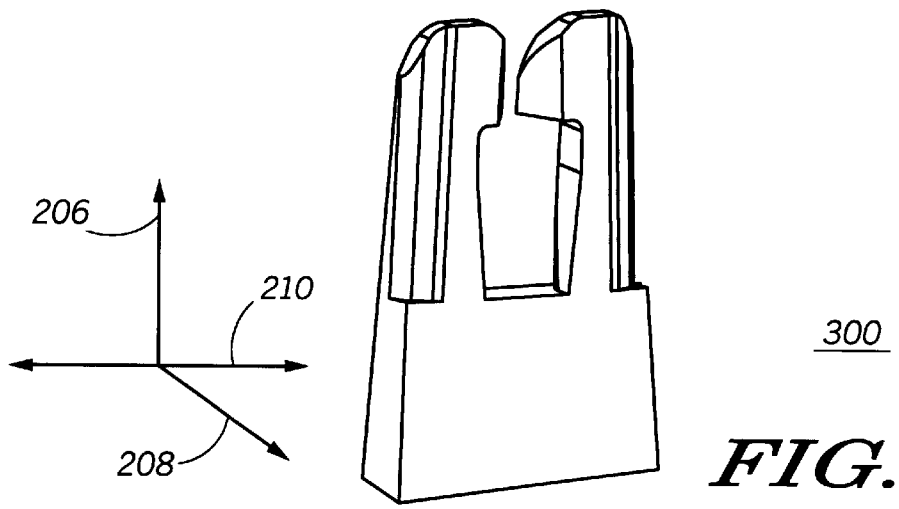
*FIG. 3*
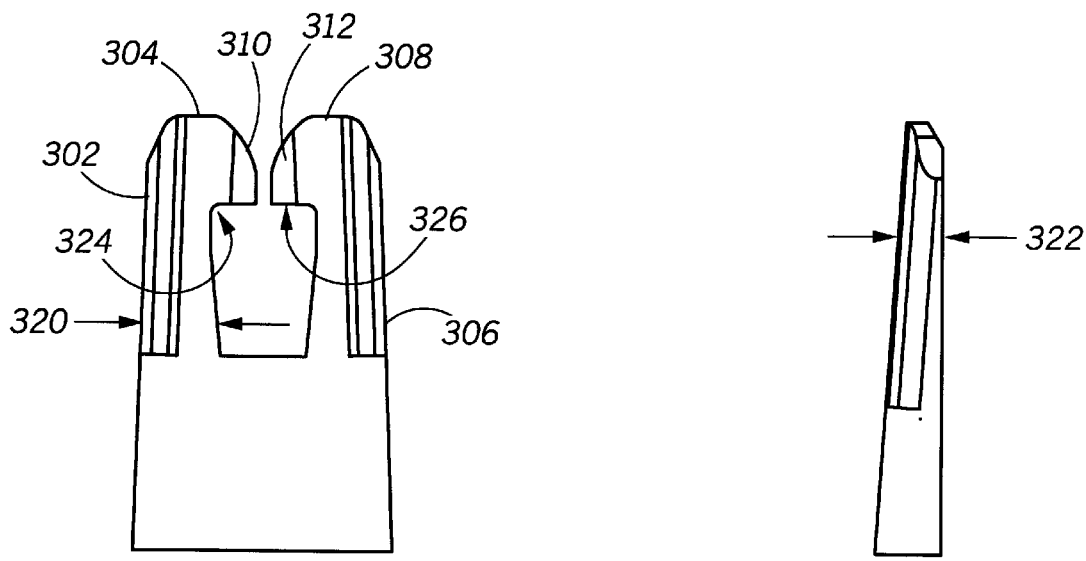
*FIG. 4*  *FIG. 5*
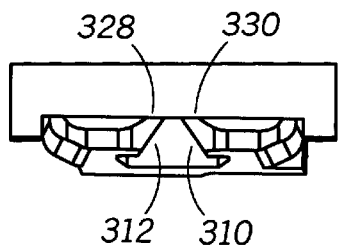
*FIG. 6*

ORTHOGONAL ASSEMBLY LATCH

BACKGROUND OF THE INVENTION

FIELD OF THE INVENTION

This invention relates in general to housing latches, and more specifically to an orthogonal assembly latch.

DESCRIPTION OF THE RELATED ART

Many electronic devices have utilized housings with front and back housing halves which when assembled protect the internal components. The most common method to assemble and secure two housing halves was with screws, or a combination of screws and snaps. Extra molded parts, such as belly bands, have also been used to keep the housing halves together, and while such extra parts have generally added to the cosmetic appearance of the electronic device when completely assembled, this has been at the expense of both the cost and complexity of assembly of the electronic device. Many electronic devices have utilized latches which were used to secure the housing halves without the use of screws. Latches, as used in prior art electronic devices, generally made it very hard to disassemble the housing without permanently damaging the housing halves or the latches, and therefor requiring the housing halves to be replaced when the electronic device was opened, such as for service.

What is needed is a method for assembling a housing for an electronic device which does not use screws to secure the housing halves together and which provides the same integrity as provided by screws. What is also needed is a method for assembling a housing which provides relatively easy disassembly of the housing after the housing is assembled.

DESCRIPTION OF THE DRAWINGS

The features of the invention which are believed to be novel are set forth with particularity in the appended claims. The invention itself may be best understood by reference to the following description when taken in conjunction with the accompanying drawings, in the several figures of which like reference numerals identify identical elements, in which, and wherein:

FIG. 3 is an orthographic view of a latching member in accordance with the present invention, FIG. 4 is a top view of the latching member in accordance with the present invention, FIG. 5 is a side view of the latching member in accordance with the present invention, FIG. 6 is an end view of the latching member in accordance with the present invention.

DETAILED DESCRIPTION OF THE INVENTION

Figure 1:
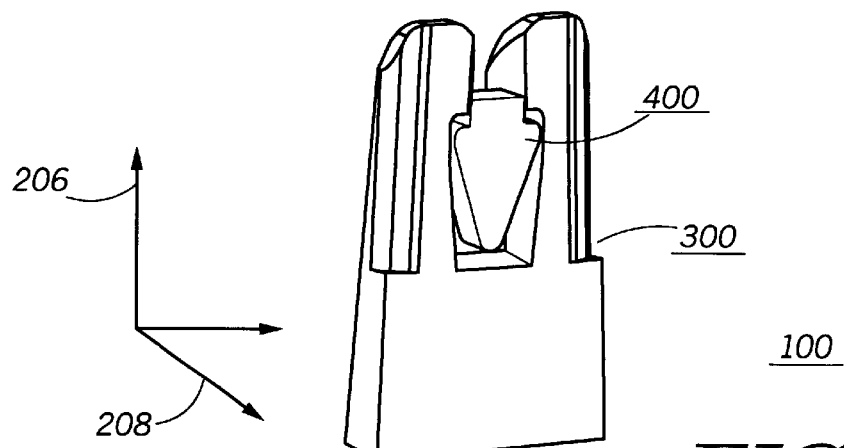
FIG. 1 is a is an orthographic view of the orthogonal assembly latch in accordance with the present invention.
Figure 2:
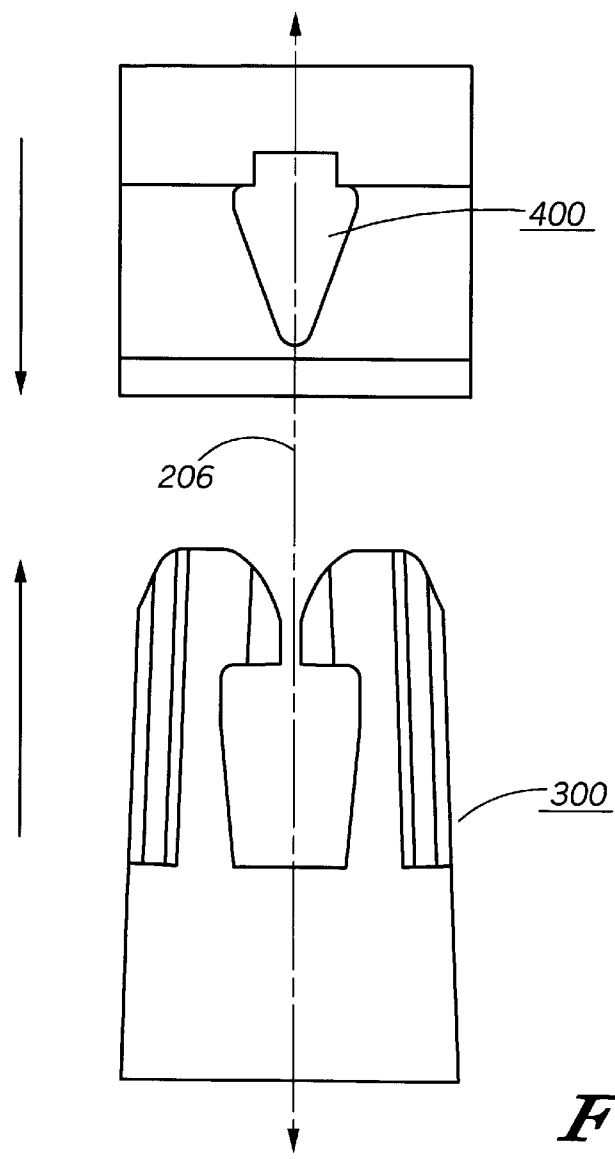
FIG. 2 is a top view of the orthogonal assembly latch being assembled in accordance with the present invention.

FIG. 1 is an orthographic view of the orthogonal assembly latch 100 in accordance with the present invention shown in the assembled position. The orthogonal assembly latch 100 includes a latching member 300 and a catch 400 to be described below. The orthogonal assembly latch 100 is shown disassembled in a top view in FIG. 2. The catch 400 has a first wedge shaped section 202 which enables engagement with the latching member 300. The catch 400 also has a second wedge shaped section 204 which enables disengagement of the latching member 300. The first wedge shaped section 202 enables engagement of the catch 400 with the latching member 300 along a first axis 206 shown in FIG. 1. The second wedge shaped section 204 enables disengagement of the catch 400 with the latching member 300 along a second axis 208. As shown in FIG. 1, the first axis 206 enabling assembly is perpendicular to the second axis 208 enabling disassembly.

FIG. 3 is an orthographic view of the latching member 300 in accordance with the present invention, and is best understood from the top view of FIG. 4, the side view of FIG. 5, and the end view of FIG. 6. Referring to FIG. 4, the latching member 300 comprises a first arm 302 having a first head 304, and a second arm 306 having a second head 308. The first wedge shaped section 202 spreads the first arm 302 and the second arm 306 along an axis 210, shown in FIG. 3, when the latching member 300 is being engaged with the catch 400. The first head 304 and the second head 308 have flat sections 326 (one of which is identified) to secure the latching member 300 to the catch 400 when the latching member 300 is fully engaged with the catch 400, as shown in FIG. 1. The first head 304 includes a bevel 310, and the second head 308 includes a bevel 312, the function of which will be described below.

The first arm 302 and the second arm 306 are tapered along a width 320, shown in FIG. 4, and a thickness 322, shown in FIG. 5. The taper allows the first arm 302 and the second arm 306 to flex along axis 210 when the latching member 300 is assembled to the catch 400, and further allows the first arm 302 and the second arm 306 to flex along axis 210 when the latching member 300 is being disassembled from the catch 400. A corner 324 (one identified) having a radius to match a radius 406 of the catch 400 provides stress relief where the first arm 302 joins the first head 304 and where the second arm 306 joins the second head 308, minimizing stress fractures from forming at the joint.

Figure 7:
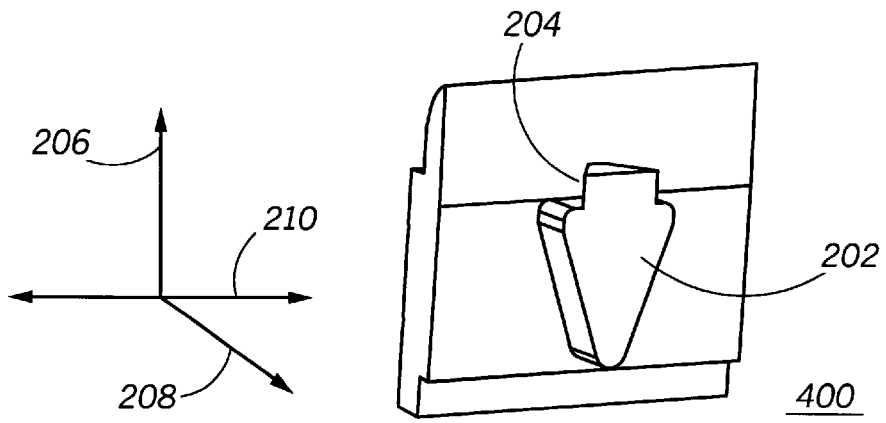
FIG. 7 is an orthographic view of a catch in accordance with the present invention.
Figure 10:
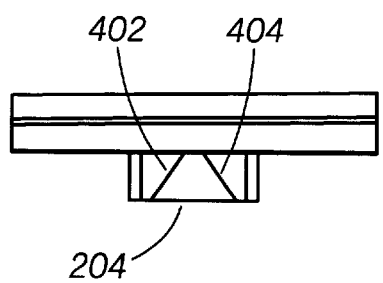
FIG. 10 is an end view of the catch in accordance with the present invention.
Figure 8:
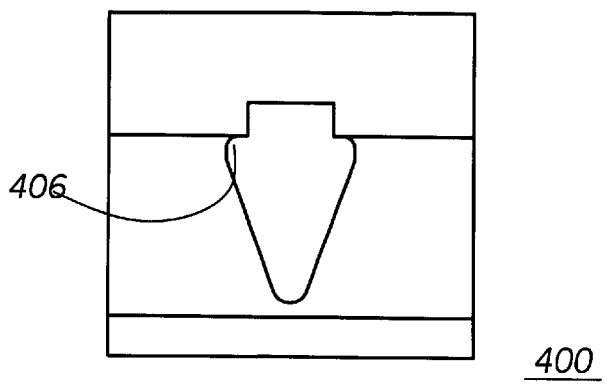
FIG. 8 is a top view of the catch in accordance with the present invention.
Figure 9:
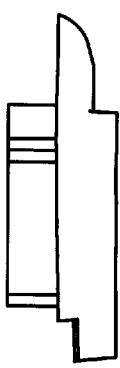
FIG. 9 is a side view of the catch in accordance with the present invention.

FIG. 7 is an orthographic view of the catch 400 in accordance with the present invention, and is best understood from the top view of FIG. 8, the side view of FIG. 9, and the end view of FIG. 10. The second wedge shaped section 204 is formed with the first beveled section 402 and the second beveled section 404 which mate with and match the bevel 310 formed on the first head 304, and the bevel 312 formed on the second head 308, respectively.

The second wedge shaped section 204 spreads the first arm 302 and the second arm 306 when the latching member 300 is being disengaged from the catch 400. Flat section 328 and flat section 330, shown in FIG. 6, are utilized to disassemble the latching member 300 from the catch 400, and prevent the latching member 300 from re-engaging with the catch 400, when the latching member 300 is disassembled from the catch 400.

Figure 11:
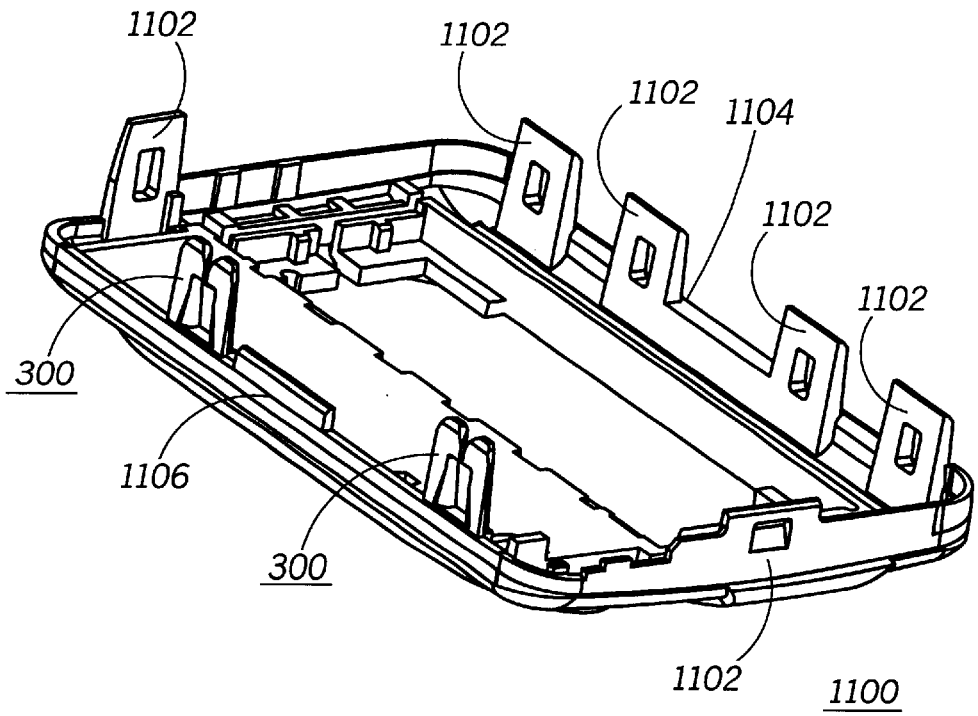
FIG. 11 is a view of a first housing section for an electronic device utilizing the orthogonal assembly latch in accordance with the present invention.
Figure 13:
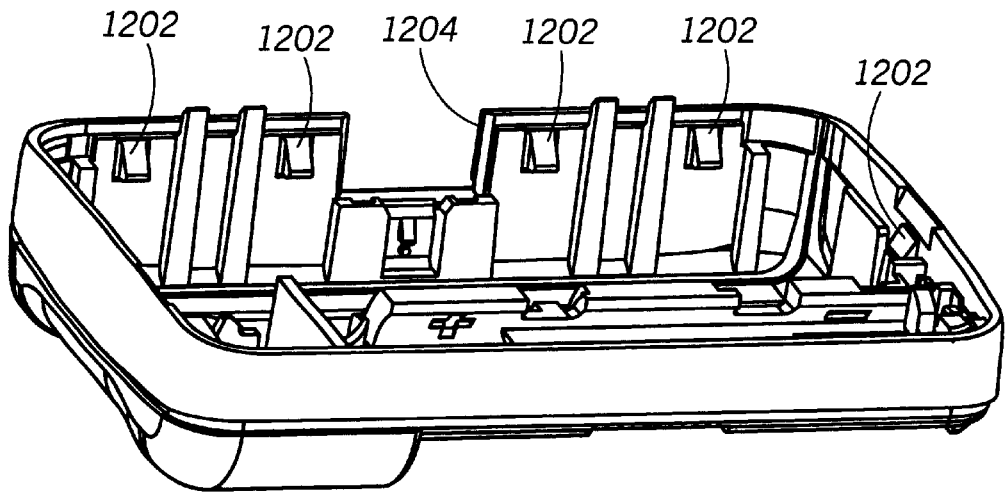
FIG. 13 is a further view of the second housing section for an electronic device utilizing the orthogonal assembly latch in accordance with the present invention.

FIG. 11 is a view of a first housing member 1100 for an electronic device utilizing the orthogonal assembly latch 100 in accordance with the present invention. At least one hook 1102 is formed contiguous with a first side 1104 of the first housing member 1100, the at least one hook 1102 engaging at least one corresponding catch member 1202 which is formed contiguous with a first side 1204 of a second housing member 1200, as shown in FIG. 13. The at least one hook 1102 and the at least one corresponding catch member 1202 secures the first side 1104 of the first housing member 1100 to the first side 1204 of the second housing member 1200, in a manner well known to one of ordinary skill in the art. It will be appreciated that more than one hook 1102 can be positioned along one or more sides of the first housing member 1100, and more than one catch member 1202 can be positioned along corresponding sides of the second housing member 1200, as required to retain the housing members closed.

Figure 12:
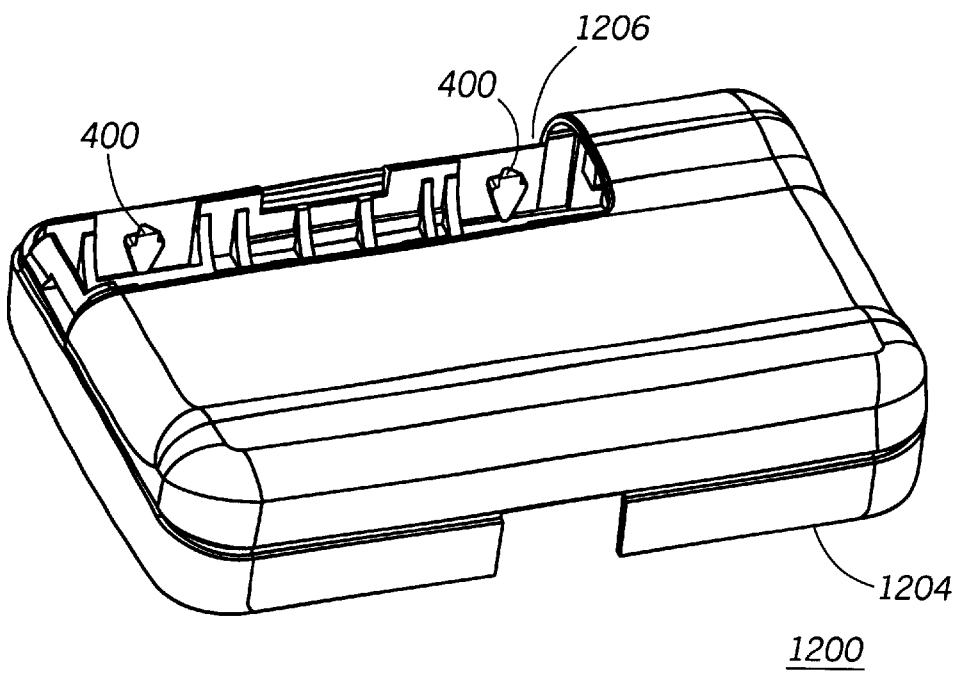
FIG. 12 is a view of a second housing section for an electronic device utilizing the orthogonal assembly latch in accordance with the present invention.

At least one latching member 300 is formed contiguous with a second side 1106 of the first housing member 1100 as shown in FIG. 11, and at least one catch 400 is formed contiguous with a second side 1206 of the second housing member 1200, as shown in FIG. 12. The at least one latching member 300 and the at least one catch 400 secures the second side 1106 of the first housing member 1100 to the second side 1206 of the second housing member 1200, as described above. It will be appreciated that more than one latching member 300 can be located along the second side 1106 of the first housing member 1100, and more than one catch 400 can be located along the second side 1206 of the second housing member 1200, as required to secure the housing members closed.

Figure 14:
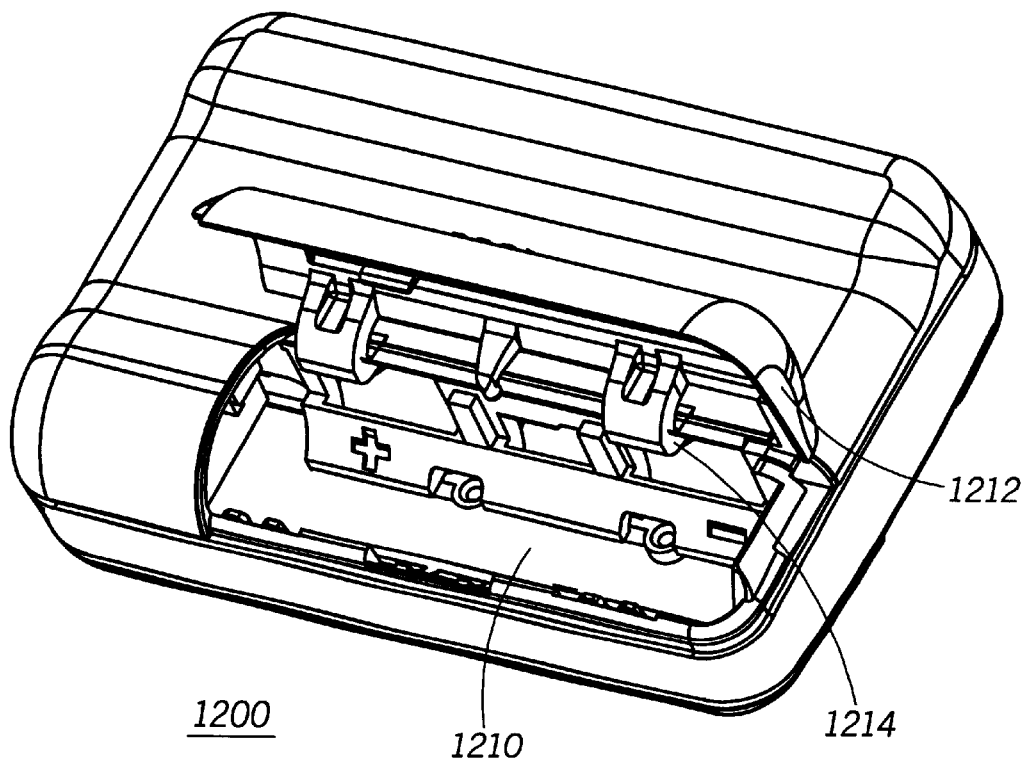
FIG. 14 is an alternate view of the second housing section for an electronic device utilizing the orthogonal assembly latch in accordance with the present invention.

FIG. 14 is an alternate view of the housing for an electronic device utilizing the orthogonal assembly latch in accordance with the present invention. As shown in FIG. 14, the first housing member 1100 preferably includes a battery compartment 1210 which retains a battery (not shown). The battery is used to power to the electronic device, which by way of example can be a pager, a cellular telephone, a two-way radio, a personal digital assistant, or any other battery operated device. A battery compartment access 1212 is provided which allows access to the battery in the battery compartment 1210. The battery compartment access 1212 can be a hinged battery door as shown in FIG. 14, or can be a slideable battery door as is well known to one of ordinary skill in the art. The battery compartment access 1212 provide a means for concealing the at least one latching member 300 when the first housing member 1100 is secured to the second housing member 1200, and also enables access to the at least one latching member 300 when the housing of the electronic device is to be opened.

In addition to concealing the latching member 300 and the catch 400 within the battery compartment 1210, a further advantage is obtained by setting the length of the latching member 300 and position of the catch 400 to be about the midpoint of the battery diameter. Thus, when a battery is within the battery compartment 1210, the battery prevents the at least one latching member 300 from disengaging with the at least one catch member 1202.

A orthogonal assembly latch 100 has been described above which is used to securely close a housing, and also enables he housing to be readily disassembled without damage to either the latching member 300 or the catch 400. Both the latching member 300 and the catch 400 can be formed as part of the housing. In the preferred embodiment of the present invention, the housing and latching member 300 and catch 400 are formed using an injection molding process from a thermoplastic resin, such as polycarbonate. It will be appreciated that other thermoplastic resins such as ABS polystyrene, nylon, and others can be utilized as well.

While specific embodiments of this invention have been shown and described, further modifications and improvements will occur to those skilled in the art. All modifications which retain the basic underlying principles disclosed and claimed herein are with the scope and spirit of the present invention.

We claim:

1. An orthogonal latch assembly, comprising:
   a latching member; and
   a catch having a first wedge shaped section enabling engagement with said latching member, and a second wedge shaped section enabling disengagement with said latching member.

2. The orthogonal latch assembly of claim 1, wherein said first wedge shaped section is contiguous with said second wedge shaped section.

3. The orthogonal latch assembly of claim 1, wherein said first wedge shaped section provides engagement of said catch with said latching member along a first axis, and
   wherein said second wedge shaped section provides disengagement of said catch with said latching member along a second axis,
   said first axis being perpendicular to said second axis.

4. The orthogonal latch assembly of claim 1, wherein said latching member is a part of a first housing member and said catch is a part of a second housing member, and wherein said latching member when engaged with said catch connects said first housing member to said second housing member.

5. The orthogonal latch assembly of claim 1 wherein said latching member comprises a first arm having a first head and a second arm having a second head 308, wherein said first wedge shaped section spreads said first arm and said second arm when said latching member is being engaged with said catch, and wherein said first head and said second head secure said latching member to said catch when said latching member is fully engaged with said catch.

6. The orthogonal latch assembly of claim 5 wherein said second wedge shaped section spreads said first arm and said second arm when said latching member is being disengaged from said catch, and wherein said first head and said second head prevent said latching member from re-engaging with said catch when said latching member is fully disengaged from said catch.

7. The orthogonal latch assembly of claim 5, wherein said second wedge shaped section is formed with a first beveled section and a second beveled section, and said first head and said second head include a bevel which matches the first beveled section and the second beveled section, respectively, when said latching member is fully engaged with said catch.

8. An orthogonal latch assembly for a housing assembly, comprising:
   at least one hook formed contiguous with a first side of a first housing member, said at least one hook for engaging at least one corresponding catch member formed contiguous with a first side of a second housing member;
   at least one latching member formed contiguous with a second side of said first housing member; and a least one catch formed contiguous with a second side of said second housing member, said at least one catch having a first wedge shaped section enabling engagement with said at least one latching member, and a second wedge shaped section enabling disengagement with said at least one latching member, wherein said at least one hook and at least one corresponding catch member secures said first side of said first housing member to said first side of said second housing member, and said at least one latching member and said at least one catch secures said second side of said first housing member to said second side of said second housing member.

9. The orthogonal latch assembly for a housing assembly of claim 8, wherein said first wedge shaped section is formed contiguous with said second wedge shaped section.

10. The orthogonal latch assembly for a housing assembly of claim 8, wherein said first wedge shaped section provides engagement of said at least one catch member with said at least one latching member along a first axis, and wherein said second wedge shaped section provides engagement of said at least one catch member with said at least one latching member along a second axis, said first axis being perpendicular to said second axis.

11. The orthogonal latch assembly for a housing assembly of claim 8, wherein said first side of said first and second housing members is opposite said second side of said first and second housing members.

12. The orthogonal latch assembly for a housing assembly of claim 8, wherein said at least one latching member comprises a first arm having a first head and a second arm having a second head 308, wherein said first wedge shaped section spreads said first arm and said second arm when said at least one latching member is being engaged with said at least one catch member, and wherein said first head and said second head secure said at least one latching member to said at least one catch member when said at least one latching member is fully engaged with said at least one catch member.

13. The orthogonal latch assembly for a housing assembly of claim 8, wherein said second wedge shaped section spreads said first arm and said second arm when said at least one latching member is being disengaged from said at least one catch member, and wherein said first head and said second head prevent said at least one latching member from re-engaging with said at least one catch member when said at least one latching member is fully disengaged from said at least one catch member.

14. The orthogonal latch assembly for a housing assembly of claim 8 further comprising at least a second hook formed contiguous with a third side of a first housing member, said at least one hook for engaging at least a second corresponding catch formed contiguous with a third side of a second housing member.

15. A housing for enclosing a device, comprising:

a first housing member having at least one hook formed contiguous with a first side thereof, and at least one latching member formed contiguous with a second side thereof; and a second housing member having at least one corresponding catch formed contiguous with a first side thereof, and at least one catch member formed contiguous with a second side thereof, said at least one catch member having a first wedge shaped section enabling engagement with said at least one latching member, and a second wedge shaped section enabling disengagement with said at least one latching member, wherein said at least one hook and at least one corresponding catch member secures said first side of said first housing member to said first side of said second housing member, and said at least one latching member and said at least catch member secures said second side of said first housing member to said second side of said second housing member.

16. The housing according to claim 15, further comprising a means for concealing said at least one latching member when said first housing member is secured to said second housing member, said means for concealing further enabling access to said latching member when the housing of the electronic device is to be opened.

17. The housing according to claim 15, wherein said product is an electronic device, and further comprises:

a battery compartment, formed as a part of said second housing member, for retaining a battery;

a battery compartment access, formed as a part of said first housing member, for accessing said battery retained in said battery compartment; and a battery retainer, for closing said battery compartment access, wherein said battery compartment is formed contiguous with said second side of said second housing member, and wherein said at least one catch member is accessible through said battery door access.

18. The housing according to claim 17, wherein said battery has a battery casing having a diameter, and wherein said at least one latching member has a length extending substantially to a midpoint of said diameter of said battery, wherein, said battery prevents said at least one latching member from disengaging with said at least one catch member when said battery is retained within said battery compartment.

19. The housing according to claim 15, wherein said at least one latching member comprises a first arm having a first head and a second arm having a second head 308, wherein said first wedge shaped section spreads said first arm and said second arm when said at least one latching member is being engaged with said at least one catch member, and wherein said first head and said second head secure said at least one latching member to said at least one catch member when said at least one latching member is fully engaged with said at least one catch member.

20. The housing according to claim 15 wherein said second wedge shaped section spreads said first arm and said second arm when said at least one latching member is being disengaged from said at least one catch member, and wherein said first head and said second head prevent said at least one latching member from re-engaging with said at least one catch member when said at least one latching member is fully disengaged from said at least one catch member.

* * * * *